US012587185B2

(12) United States Patent
Qiu et al.

(10) Patent No.: US 12,587,185 B2
(45) Date of Patent: Mar. 24, 2026

(54) DEVICE FOR INPUTTING ELEVATOR CALL COMMANDS AND ELEVATOR CONTROL SYSTEM

(71) Applicant: Otis Elevator Company, Farmington, CT (US)

(72) Inventors: Heping Qiu, Shanghai (CN); Qiyun Sun, Shanghai (CN)

(73) Assignee: OTIS ELEVATOR COMPANY, Farmington, CT (US)

( * ) Notice: Subject to any disclaimer, the term of this patent is extended or adjusted under 35 U.S.C. 154(b) by 7 days.

(21) Appl. No.: 18/889,776

(22) Filed: Sep. 19, 2024

(65) Prior Publication Data

US 2025/0105838 A1 Mar. 27, 2025

(30) Foreign Application Priority Data

Sep. 21, 2023 (CN) .......................... 202311227813.X

(51) Int. Cl.
| | |
|---|---|
| *H03K 17/18* | (2006.01) |
| *B66B 1/46* | (2006.01) |
| *B66B 1/52* | (2006.01) |
| *H01H 13/02* | (2006.01) |
| *H05B 45/10* | (2020.01) |
| *H05B 45/325* | (2020.01) |

(52) U.S. Cl.
CPC ............. *H03K 17/18* (2013.01); *B66B 1/462* (2013.01); *B66B 1/52* (2013.01); *H01H 13/023* (2013.01); *H05B 45/10* (2020.01); *H05B 45/325* (2020.01)

(58) Field of Classification Search
CPC .......... H03K 17/18; B66B 1/462; B66B 1/52; B66B 2201/463; B66B 1/468; B66B 1/46; B66B 1/463; B66B 3/004; B66B 3/002; H01H 13/023; H01H 2013/026; H05B 45/10; H05B 45/325
See application file for complete search history.

(56) References Cited

U.S. PATENT DOCUMENTS 5,223,678 A * 6/1993 McCurrach ............. B66B 1/462
340/815.48

* cited by examiner

*Primary Examiner* — Jung Kim
(74) *Attorney, Agent, or Firm* — CANTOR COLBURN LLP

(57) ABSTRACT

A device for inputting an elevator calling command and an elevator control system including the device. A device for inputting an elevator calling includes one or more button units, each of the button units including a switching element and a variable resistance circuit coupled with the switching element. The variable resistance circuit includes a button switch and a display element coupled in parallel, and a resistance value of the variable resistance circuit varies with a state of the button switch. The device further includes a control unit configured to determine a state of a corresponding button switch based on the resistance value of the variable resistance circuit within each of the button units, and to apply a pulse width modulation signal having different duty cycles onto a control terminal of a corresponding switching element based on the state as determined.

14 Claims, 5 Drawing Sheets

From control unit — PWM signal S1 or S2 →  Switching element  ⌒ 111A

⌒ 111B

To control unit ← Measured signal — Button switch ⌒ BS1    Display element ⌒ DE

111

DEVICE FOR INPUTTING ELEVATOR CALL COMMANDS AND ELEVATOR CONTROL SYSTEM

FOREIGN PRIORITY

This application claims priority to Chinese Patent Application No. 202311227813.X, filed Sep. 21, 2023, and all the benefits accruing therefrom under 35 U.S.C. § 119, the contents of which in its entirety are herein incorporated by reference.

TECHNICAL FIELD OF INVENTION

The present application relates to elevator technology and, in particular, to a device for inputting an elevator calling command and an elevator control system comprising the device.

BACKGROUND OF THE INVENTION

Devices for inputting elevator calling commands, such as Car Operation Panel (COP) and Hall Button Panel (HBP), usually contain multiple buttons, each of which needs to be equipped with multiple wires, some of the wires are used for light-emitting control of display elements (e.g., light-emitting diode (LED)), and others are used for monitoring status of the buttons' switching. Due to the limited internal space of the COP and HBP, when the number of buttons is large (e.g., in elevator systems of high-rise or ultra-high-rise buildings), the layout of wires will become difficult. In addition, the increase in the number of wires also leads to an increase in the cost of wire harnesses.

SUMMARY OF THE INVENTION

In accordance with an aspect of the present application, there is provided a device for inputting an elevator calling command, comprising one or more button units, each of the button units comprising a switching element and a variable resistance circuit coupled with the switching element. The variable resistance circuit comprises a button switch and a display element coupled in parallel, and a resistance value of the variable resistance circuit varies with a state of the button switch. The device further comprises a control unit configured to determine a state of a corresponding button switch based on the resistance value of the variable resistance circuit within each of the button units, and to apply a pulse width modulation signal having different duty cycles onto a control terminal of a corresponding switching element based on the state as determined.

In the above device, optionally, the switching element is one of the following: a metal-oxide semiconductor field effect transistor, a transistor, and a relay, and the display element is a light-emitting diode.

In the above device, optionally, the control unit comprises one or more microcontrollers, each of the microcontrollers comprising memory, a processor core, a plurality of first ports and a plurality of second ports. In particular, the processor core is configured to execute a computer program stored in the memory, each of the first ports is coupled with the control terminal of the switching element within one of the button units, and each of the second ports is coupled with a connection point between the switching element and the variable resistance circuit within each of the button units.

In some embodiments, the above device is a car operation panel or a hall button panel.

In the above device, optionally, the control unit determines the state of the button switch within each of the button units in the following manner: determining that the button switch is in an open state if an integral value of a voltage signal acquired via the second port for a set duration is greater than a threshold value, otherwise, determining that the button switch is in a closed state.

In the above device, optionally, the control unit applies the pulse width modulation signal having different duty cycles onto the control terminal of the switching element within each button switch in the following manner: applying a first pulse width modulation signal onto the control terminal of the switching element via the first port when the button switch is in the open state, and applying a second pulse width modulation signal onto the control terminal of the switching element via the first port when the button switch is in the closed state, the second pulse width modulation signal having a higher duty cycle than the first pulse width modulation signal. In particular, the duty cycle of the first pulse width modulation signal is set such that light emitted by the light-emitting diode is invisible to naked eyes, and the duty cycle of the second pulse width modulation signal is set such that the light emitted by the light-emitting diode is visible to the naked eyes.

In accordance with another aspect of the present application, there is provided an elevator control system comprising a plurality of elevator calling devices and an elevator controller. In the elevator control system, each elevator calling device comprises one or more button units, each of the button units comprises a switching element, a variable resistance circuit coupled with the switching element, and a control unit. The variable resistance circuit comprises a button switch and a display element coupled in parallel, and a resistance value of the variable resistance circuit varies with a state of the button switch. The control unit is configured to determine a state of a corresponding button switch based on the resistance value of the variable resistance circuit within each of the button units, to apply a pulse width modulation signal having different duty cycles onto a control terminal of a corresponding switching element based on the state as determined, and to generate an elevator calling request. The elevator controller is coupled with the elevator calling devices and configured to generate a control command in response to the elevator calling request.

BRIEF DESCRIPTION OF THE DRAWINGS

The above and/or other aspects and advantages of the present application will be clearer and more easily understood from the following description of various aspects in conjunction with the accompanying drawings, in which the same or similar units are denoted by the same reference numerals. The accompanying drawings include.

DETAILED DESCRIPTION OF THE INVENTION

The present application is described more fully below with reference to the accompanying drawings, in which illustrative embodiments of the application are illustrated. However, the present application may be implemented in different forms and should not be construed as limited to the embodiments presented herein. The presented embodiments are intended to make the disclosure herein comprehensive and complete, so as to more comprehensively convey the protection scope of the application to those skilled in the art.

In this specification, terms such as "comprising" and "including" mean that in addition to units and steps that are directly and clearly stated in the specification and claims, the technical solution of the application does not exclude the presence of other units and steps that are not directly and clearly stated in the specification and claims.

Unless otherwise specified, terms such as "first" and "second" do not indicate the order of the units in terms of time, space, size, etc., but are merely used to distinguish the units.

In this specification, a "switching element" refers to an element that can achieve functions such as opening or closing a circuit, interrupting current, or causing current to flow to other circuits, etc., and which usually contains a control terminal onto which a control signal is applied to perform the above functions. Examples of switching elements include, but are not limited to, a metal-oxide semiconductor field effect transistor (MOS), a transistor, a relay and the like.

Figure 1:
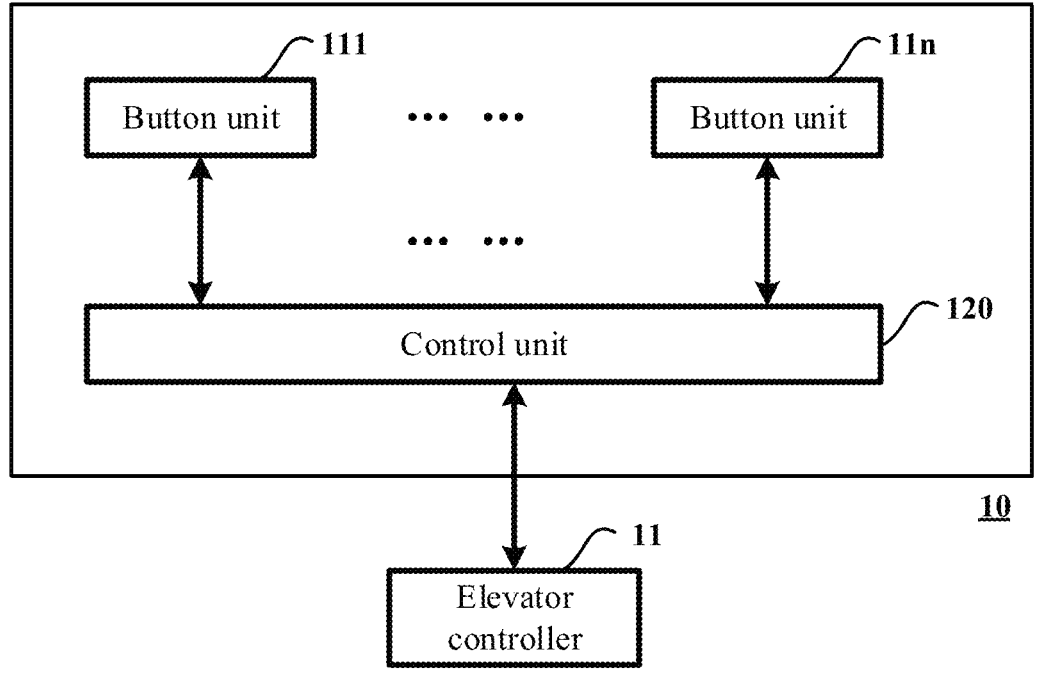
FIG. 1 is a schematic block diagram of a device for inputting an elevator calling command in accordance with some embodiments of the present application.
Figure 2:
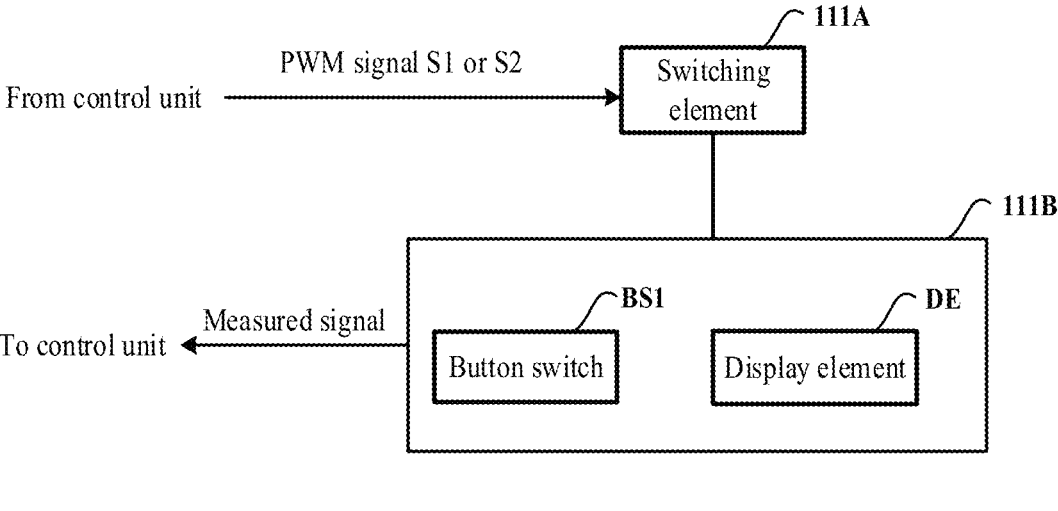
FIG. 2 is a schematic block diagram of a button unit in the device shown in FIG. 1.

FIG. 1 is a schematic block diagram of a device for inputting an elevator calling command in accordance with some embodiments of the present application. The device shown in FIG. 1 may be used as a car operation panel (COP) and a hall button panel (HBP). FIG. 2 is a schematic block diagram of a button unit in the device shown in FIG. 1.

Referring to FIG. 1, a device 10 for inputting an elevator calling command comprises one or more button units 111~11*n* and a control unit 120. As shown in FIG. 2, each of the button units 111~11*n* (e.g., the button unit 111) comprises a switching element 111A and a variable resistance circuit 111B coupled in series. In some embodiments of the present application, the variable resistance circuit 111B comprises a button switch BS1 and a display element DE1 (e.g., one or more LEDs), which are separately provided on two branch circuits connected in parallel. When the button switch BS1 is in a closed state and in an open state, although the variable resistance circuit 111B is still conducting (i.e., the branch circuit on which the display element is provided will always remain conducting, regardless of the state of the button switch), a resistance value of the variable resistance circuit will be different, thus reflecting the state in which the button switch BS1 is in. In some embodiments, it is possible to convert a measurement of the resistance value into a measurement of a voltage across the variable resistance circuit.

Referring to FIGS. 1 and 2, the control unit 120 is configured to determine, based on the resistance value of the variable resistance circuit 111B within each of the button units 111~11*n* (still using the button unit 111 as an example) or the voltage across the variable resistance circuit, different states of the button switch BS1, and to apply a pulse width modulation signal (PWM) having different duty cycles onto a control terminal of the switching element 111A with respect to the different states of the button switch BS1, thereby causing the display element DE1 to emit light with different brightness, thereby providing a visualized indication as to whether the button switch BS1 is pressed or not.

Exemplarily, a first PWM signal S1 may be applied onto the control terminal of the switching element 111A when the button switch BS1 is in the open state, and a second PWM signal S2 may be applied onto the control terminal of the switching element 111A when the button switch BS1 is in the closed state, wherein the second PWM signal S2 has a duty cycle higher than that of the first PWM signal S1, so the a luminous intensity of the display element DE1 when the button switch BS1 is in the closed state is greater than that when the button switch BS1 is in the open state. In particular, in order to distinguish the state of the button switch more significantly, the duty cycle of the first PWM signal may be set such that light emitted by the display element (e.g., the light-emitting diode) is invisible to naked eyes, and the duty cycle of the second PWM signal may be set such that the light emitted by the display element is visible to the naked eyes.

The control unit 120 is further configured to generate a corresponding elevator calling request upon determining that the button switch is in the closed state and send the elevator calling request to the elevator controller 11. The elevator controller 11 may be implemented using a general-purpose microprocessor executing a computer program stored on a storage medium to perform the operations described herein. Alternatively, controller 20 may be implemented in hardware (e.g., ASIC, FPGA) or in a combination of hardware/software.

In some embodiments, the control unit 120 comprises a microcontroller that is connected with each of the button units 111~11*n* and implements the functions of the control unit 120 (including, for example, but not limited to, determining the state of the button switch within each of the button units, selecting the PWM signals applied onto the switching elements, and generating the elevator calling request based on the state of the button switch, etc.).

Figure 3:
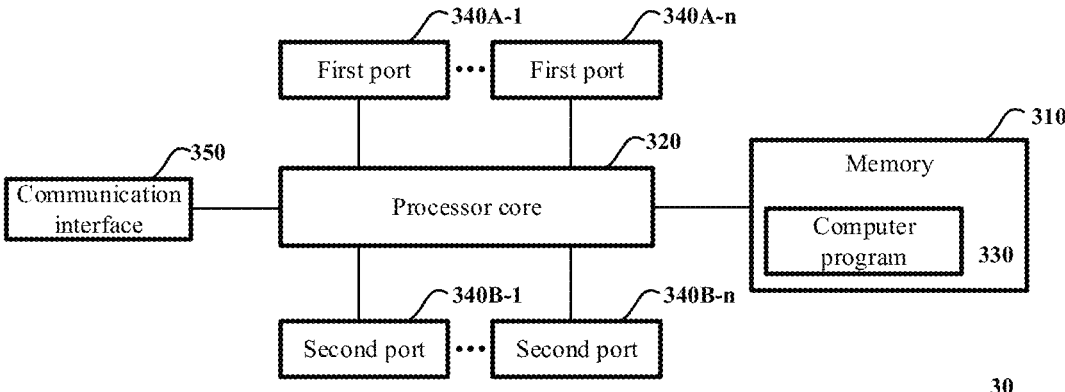
FIG. 3 is a schematic block diagram of a microcontroller included in a control unit.

FIG. 3 is a schematic block diagram of the microcontroller included in the control unit 120. As shown in FIG. 3, the microcontroller 30 comprises memory 310 (e.g., a non-volatile memory such as a flash memory, a ROM, a hard disk drive, a magnetic disk, an optical disc), a processor core 320, a computer program 330 stored on the memory 310 and runnable on the processor core 320, a port group 340, and a communication interface 350.

Continuing to refer to FIG. 3, the port group 340 comprises a plurality of first ports 340A-1 to 340A-n, a plurality of second ports 340B-1 to 340B-n. Each of the first ports is coupled with the control terminal of the switching element within the corresponding button unit (e.g., the first port 340A-1 is coupled with the control terminal of the switching element 111A within the button unit 111), whereby the processor core 320 may apply a PWM signal having a corresponding duty cycle onto the switching element based on the state of the button switch by running the computer program 330.

Each of the second ports is used to sample the resistance value of the variable resistance circuit within the corresponding button unit or a voltage signal across the variable resistance circuit, for example, the second port 340B-1 may be coupled to a connection point between the switching element 111A and the variable resistance circuit 111B within the button unit 111. As a result, the processor core 320 may determine the state of the button switch based on the voltage across the variable resistance circuit by running the computer program 330. Exemplarily, the voltage for determining the state of the button switch may be an integral value of the voltage signal acquired via the second port for a set duration, and the processor core 320 performs a judgment in accordance with the following logic by running the computer program 330: if the integral value is greater than a threshold value, it is determined that the button switch is in the open state, otherwise, it is determined that the button switch is in the closed state.

It should be noted that the plurality of button units 111~11n may be connected with the microcontroller 30 in a multiplexed manner for the consideration of reducing the number of occupied I/O ports. Exemplarily, the single second port may be connected via a multiplexing switch to the connection point between the switching element and the variable resistance circuit within the plurality of button units. When the voltage across the variable resistance circuit within one of the button units needs to be sampled, the second port may be selected to be connected with the connection point within the button unit.

In some embodiments, the microcontroller 30 establishes a communication connection (e.g., via a cable or wireless network) with the elevator controller via the communication interface 350. By running the computer program 330, the processor core 320 may generate a corresponding elevator calling request upon determining that the button switch is in the closed state and send the generated elevator calling request to the elevator controller.

In other embodiments, the control unit 120 may comprise a plurality of microcontrollers, with each of the microcontrollers being associated with one or more of the button units 111~11n. Specifically, the button units 111~11n may be divided into m groups, with each of the microcontrollers being associated with a corresponding group of button units and implementing the functions of the control unit 120 (including, for example, but not limited to, determining the state of the button switch within the button unit, selecting the PWM signals applied onto the switching elements, and generating the elevator calling request based on the state of the button switch, etc.) on the button units within the group.

Figure 4:
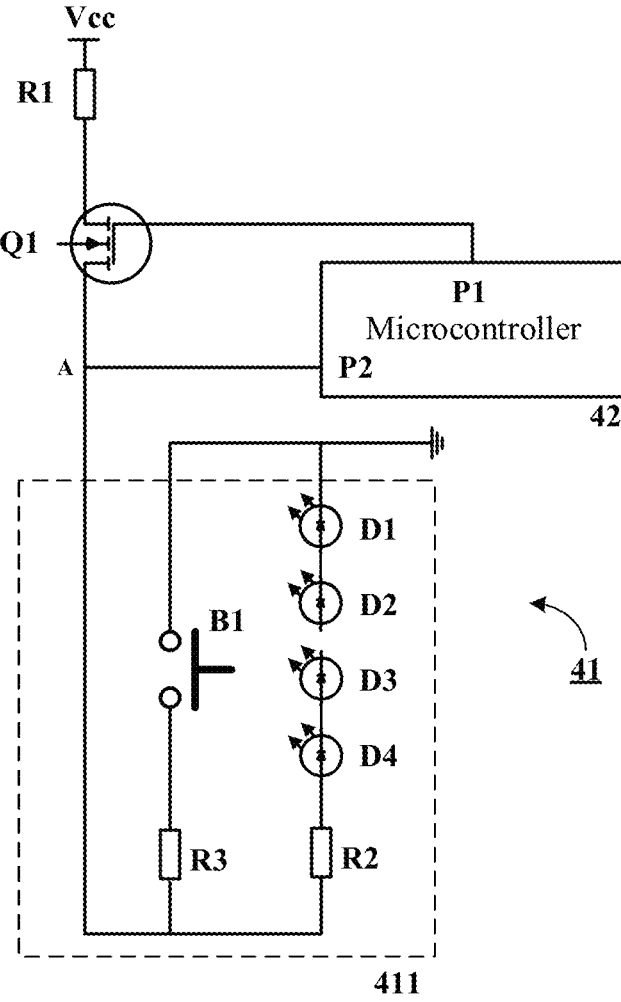
FIG. 4 is a circuit schematic diagram of a button unit in accordance with some other embodiments of the present application.

FIG. 4 is a circuit schematic diagram of a button unit in accordance with some other embodiments of the present application. The button unit shown in FIG. 4 may be used as a specific embodiment of the button units 111~11n in the device 10 shown in FIG. 1. It should be noted that for the purpose of simplifying the description, FIG. 4 contains only a single button unit, but it is not difficult for a person skilled in the art to understand that each of the button units 111~11n may adopt the same or similar circuit structure as shown.

As shown in FIG. 4, the button unit 41 comprises a switching element Q1, a button switch B1, resistors R1~R3, and light-emitting diodes D1~D4.

Referring to FIG. 4, a source or drain of the switching element Q1 (hereinafter referred to as a MOS tube as an example) is connected with a power supply VCC via the resistor R1, the drain or source is connected with a variable resistance circuit 411 comprising the resistors R2, R3, the button switch B1, and the light-emitting diodes D1~D4, and a gate (equivalent to the above-described control terminal) is connected with a port P1 (equivalent to the above-described first port) of a microcontroller 42. As a result, the microcontroller 42 may apply a pulse width modulation signal having different duty cycles (such as the above-described signals S1 and S2) onto the gate of the switching element Q1 via the port P1.

As shown in FIG. 4, one end of the variable resistance circuit 411 is connected with the switching element Q1 and a port P2 of the microcontroller 42 (equivalent to the above-described second port), and the other end is grounded.

In the improved structure of the circuit shown in FIG. 4, the port P2 of the microcontroller 42 may be connected to a connection point A of the switching element Q1 and the variable resistance circuit 411 via a multiplexing switch. When a voltage across the variable resistance circuit 411 within the button unit 41 needs to be sampled, the port P2 may be connected with the end by controlling the multiplexing switch.

Continuing to refer to FIG. 4, the variable resistance circuit 411 comprises two branch circuits connected in parallel, wherein the resistor R3 and the button switch B1 are connected in series within one of the branch circuits, and the resistor R2 and the light-emitting diodes D1~D4 are connected in series within the other branch circuit.

The following describes the operation principle of the circuit shown in FIG. 4.

When the button switch B1 is in the open state and the switching element Q1 is in a conductive state, current flows through the resistors R1, R2 and the light-emitting diodes D1~D4, at which time a voltage VA at the end A is (assuming no voltage drop across the light-emitting diodes D1~D4):

$$V_A = \frac{R_2}{R_1 + R_2} x V_{cc} \tag{1}$$

VCC is the voltage of the power supply VCC, R1 and R2 are the resistance values of resistors R1 and R2 respectively.

When the button switch B1 is in the closed state and the switching element Q1 is in a conductive state, current flows through both branches of the variable resistance circuit 411 at the same time, at which time a voltage V'A at the end A is (assuming no voltage drop across the button switch B1 and the light-emitting diodes D1~D4):

$$V^1{}_A = \frac{R_2//R_3}{R_1 + R_2//R_3} x V_{cc} \tag{1}$$

VCC is the voltage of the power supply VCC, R1 is the resistance value of resistor R1, R2//R3 is the equivalent resistance value of resistors R2 and R3 connected in parallel.

Since the equivalent resistance value R2//R3 is less than the resistance value R2, VA is greater than V'A, i.e., the voltage at the end A when the button switch B1 is in the open state is greater than the voltage at the end A when the button switch B1 is in the closed state. By adjusting the resistance value of one or more of the resistors R1~R3, a significant difference between VA and V'A may be presented.

When the microcontroller 42 determines that the button switch B1 is in the open state based on the voltage at the end A, it applies, via the port P1, a PWM signal having a low duty cycle (e.g., the above-described signal S1) onto the gate of the switching element Q1. At this time, due to the short conduction time, the brightness of the light-emitting diodes D1~D4 is weak. By setting a sufficiently low duty cycle, light emitted by the light-emitting diodes D1~D4 may be made invisible to the naked eyes.

On the other hand, when the microcontroller 42 determines that the button switch B1 is in the closed state based on the voltage at the end A, it applies, via the port P1, a PWM signal having a high duty cycle (e.g., the above-described signal S2) onto the gate of the switching element Q1. At this time, due to the long conduction time, the brightness of the light-emitting diodes D1~D4 is strong. By setting a sufficiently high duty cycle, light emitted by the light-emitting diodes D1~D4 may be made visible to the naked eyes.

In the embodiments described above with the help of FIGS. 1-4, it is only necessary to equip each button with two wires (one is the input wire used to connect the display element and the button switch, and the other is the common ground wire) to achieve the light-emitting control function of the display element and the monitoring function of the button switch state, which will significantly reduce the number of wires in the car operation panel and the hall button panel, and greatly reduce the complexity of wiring design and product manufacturing cost.

Figure 5:
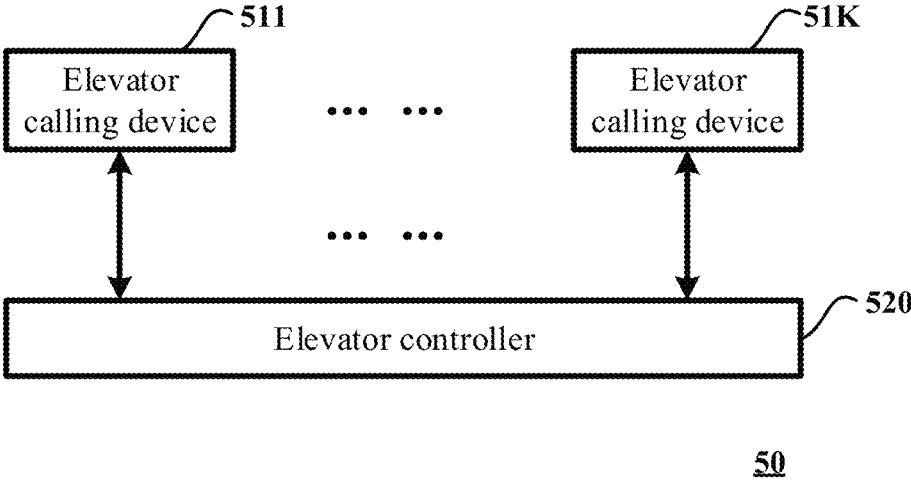
FIG. 5 is a schematic block diagram of an elevator control system in accordance with some other embodiments of the present application.

FIG. 5 is a schematic block diagram of an elevator control system in accordance with some other embodiments of the present application.

An elevator control system 50 shown in FIG. 5 includes a plurality of elevator calling devices 511-51K and an elevator controller 520. The elevator calling devices 511-51K may be devices for inputting elevator calling commands such as a car operation panel (COP) and a hall button panel (HBP), which are deployed inside the car and in proximity to the hall. In some embodiments, each elevator calling device may have one or more of the features of the device for inputting the elevator calling command described above with the aid of FIGS. 1-4.

Referring to FIG. 5, the elevator controller 520 is coupled with the elevator calling devices 511-51K and configured to receive an elevator calling request from the elevator calling device and generate a corresponding control command (e.g., commanding the car to travel to a specified floor, etc.) in response to the elevator calling request.

Those skilled in the art will appreciate that the various illustrative logical blocks, modules, circuits, and algorithm steps described herein may be implemented as electronic hardware, computer software, or combinations of both.

To demonstrate this interchangeability between the hardware and software, various illustrative components, blocks, modules, circuits, and steps have been described above generally in terms of their functionality. Whether such functionality is implemented in hardware or software depends on the particular application and design constraints imposed on the overall system. Those skilled in the art may implement the described functionality in changing ways for the particular application. However, such implementation decisions should not be interpreted as causing a departure from the scope of the present application.

Although only a few of the specific embodiments of the present application have been described, those skilled in the art will recognize that the present application may be embodied in many other forms without departing from the spirit and scope thereof. Accordingly, the examples and implementations shown are to be regarded as illustrative and not restrictive, and various modifications and substitutions may be covered by the application without departing from the spirit and scope of the application as defined by the appended claims.

The embodiments and examples presented herein are provided to best illustrate embodiments in accordance with the present technology and its particular application, and to thereby enable those skilled in the art to implement and use the present application. However, those skilled in the art will appreciate that the above description and examples are provided for convenience of illustration and example only. The presented description is not intended to cover every aspect of the application or to limit the application to the precise form disclosed.

What is claimed is:

1. A device for inputting an elevator calling command, comprising:

one or more button units, each of the button units comprising:

a switching element, and a variable resistance circuit coupled with the switching element, the variable resistance circuit comprising a button switch and a display element coupled in parallel, and a resistance value of the variable resistance circuit varying with a state of the button switch; and a control unit configured to determine a state of a corresponding button switch based on the resistance value of the variable resistance circuit within each of the button units, and to apply a pulse width modulation signal having different duty cycles onto a control terminal of a corresponding switching element based on the state as determined.

2. The device of claim 1, wherein the switching element is one of the following: a metal-oxide semiconductor field effect transistor, a transistor, and a relay, and the display element is a light-emitting diode.

3. The device of claim 1, wherein the control unit comprises one or more microcontrollers, each of the microcontrollers comprising:

memory;

a processor core configured to execute a computer program stored in the memory; and a plurality of first ports, each of the first ports being coupled with the control terminal of the switching element within one of the button units;

a plurality of second ports, each of the second ports being coupled with a connection point between the switching element and the variable resistance circuit within each of the button units.

4. The device of claim 1, wherein the device is a car operation panel or a hall button panel.

5. The device of claim 3, wherein the control unit is configured to determine the state of the button switch within each of the button units in the following manner: determining that the button switch is in an open state if an integral value of a voltage signal acquired via the second port for a set duration is greater than a threshold value, otherwise, determining that the button switch is in a closed state.

6. The device of claim 3, wherein the control unit is configured to apply the pulse width modulation signal having different duty cycles onto the control terminal of the switching element within each button switch in the following manner: applying a first pulse width modulation signal onto the control terminal of the switching element via the first port when the button switch is in an open state, and applying a second pulse width modulation signal onto the control terminal of the switching element via the first port when the button switch is in a closed state, the second pulse width modulation signal having a higher duty cycle than the first pulse width modulation signal.

7. The device of claim 6, wherein the duty cycle of the first pulse width modulation signal is set such that light emitted by the light-emitting diode is invisible to naked eyes, and the duty cycle of the second pulse width modulation signal is set such that the light emitted by the light-emitting diode is visible to the naked eyes.

8. An elevator control system comprising:
a plurality of elevator calling devices, each elevator calling device comprising:
one or more button units, each of the button units comprising:
a switching element;
a variable resistance circuit coupled with the switching element, the variable resistance circuit comprising a button switch and a display element coupled in parallel, and a resistance value of the variable resistance circuit varying with a state of the button switch; and
a control unit configured to determine a state of a corresponding button switch based on the resistance value of the variable resistance circuit within each of the button units, to apply a pulse width modulation signal having different duty cycles onto a control terminal of a corresponding switching element based on the state as determined, and to generate an elevator calling request; and
an elevator controller coupled with the elevator calling devices and configured to generate a control command in response to the elevator calling request.

9. The elevator control system of claim 8, wherein the switching element is one of the following: a metal-oxide semiconductor field effect transistor, a transistor, and a relay, and the display element is a light-emitting diode.

10. The elevator control system of claim 8, wherein the control unit comprises one or more microcontrollers, each of the microcontrollers comprising:
memory;
a processor core configured to execute a computer program stored in the memory; and
a plurality of first ports, each of the first ports being coupled with the control terminal of the switching element within one of the button units;

a plurality of second ports, each of the second ports being coupled with a connection point between the switching element and the variable resistance circuit within each of the button units.

11. The elevator control system of claim 8, wherein the elevator calling device is a car operation panel or a hall button panel.

12. The elevator control system of claim 10, wherein the control unit determines the state of the button switch within each of the button units in the following manner: determining that the button switch is in an open state if an integral value of a voltage signal acquired via the second port for a set duration is greater than a threshold value, otherwise, determining that the button switch is in a closed state.

13. The elevator control system of claim 10, wherein the control unit applies the pulse width modulation signal having different duty cycles onto the control terminal of the switching element within each button switch in the following manner: applying a first pulse width modulation signal onto the control terminal of the switching element via the first port when the button switch is in an open state, and applying a second pulse width modulation signal onto the control terminal of the switching element via the first port when the button switch is in a closed state, the second pulse width modulation signal having a higher duty cycle than the first pulse width modulation signal.

14. The elevator control system of claim 13, wherein the duty cycle of the first pulse width modulation signal is set such that light emitted by the light-emitting diode is invisible to naked eyes, and the duty cycle of the second pulse width modulation signal is set such that the light emitted by the light-emitting diode is visible to the naked eyes.

* * * * *